US012719433B2

(12) United States Patent
Inoue et al.

(10) Patent No.: US 12,719,433 B2
(45) Date of Patent: Aug. 25, 2026

(54) ACOUSTIC WAVE DEVICE AND METHOD FOR MANUFACTURING ACOUSTIC WAVE DEVICE

(71) Applicant: Murata Manufacturing Co., Ltd., Nagaokakyo (JP)

(72) Inventors: Kazunori Inoue, Nagaokakyo (JP); Katsumi Suzuki, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 181 days.

(21) Appl. No.: 18/371,051

(22) Filed: Sep. 21, 2023

(65) Prior Publication Data

US 2024/0014793 A1 Jan. 11, 2024

Related U.S. Application Data

(63) Continuation of application No. PCT/JP2022/016891, filed on Mar. 31, 2022.

(Continued)

(51) Int. Cl.
*H03H 9/02* (2006.01)
*H03H 3/02* (2006.01)

(52) U.S. Cl.
CPC .......... *H03H 3/02* (2013.01); *H03H 9/02015* (2013.01); *H03H 9/02228* (2013.01)

(58) Field of Classification Search
CPC ....................... H03H 9/02015; H03H 9/02228
See application file for complete search history.

(56) References Cited

U.S. PATENT DOCUMENTS

2011/0273061 A1* 11/2011 Thalmayr .......... H03H 9/02834 310/346
2014/0152145 A1 6/2014 Kando et al.
(Continued)

FOREIGN PATENT DOCUMENTS

JP 2005311511 A 11/2005
JP 2010147875 A 7/2010
(Continued)

OTHER PUBLICATIONS

International Search Report in PCT/JP2022/016891, mailed Jun. 14, 2022, 3 pages.
(Continued)

*Primary Examiner* — Samuel S Outten
(74) *Attorney, Agent, or Firm* — Keating & Bennett, LLP

(57) ABSTRACT

An acoustic wave device includes a support including a support substrate and an intermediate layer, a piezoelectric layer on or over the intermediate layer and including a through-hole, a functional electrode on the piezoelectric layer, and a hollow portion in the support substrate and the intermediate layer. At least a portion of the functional electrode overlaps the hollow portion. The hollow portion includes first and second hollow regions, the first hollow region being located in the intermediate layer and communicating with the through-hole, the second hollow region being located between the first hollow region and a bottom surface of a recess in the support substrate, the recess opening toward the first hollow region. The intermediate layer includes a portion protruding inward from a peripheral portion of the recess in the support substrate as viewed from a cross section in a thickness direction of the support.

13 Claims, 15 Drawing Sheets

Related U.S. Application Data

(60) Provisional application No. 63/168,304, filed on Mar. 31, 2021.

(56) References Cited

U.S. PATENT DOCUMENTS

| | | | | |
|---|---|---|---|---|
| 2020/0235719 | A1* | 7/2020 | Yantchev | H03H 9/562 |
| 2020/0321939 | A1 | 10/2020 | Turner et al. | |
| 2022/0209741 | A1* | 6/2022 | Weng | H03H 9/174 |

FOREIGN PATENT DOCUMENTS

| | | | |
|---|---|---|---|
| JP | 2012257019 | A | 12/2012 |
| WO | 2012073871 | A1 | 6/2012 |
| WO | 2016147687 | A1 | 9/2016 |

OTHER PUBLICATIONS

Written Opinion in PCT/JP2022/016891, mailed Jun. 14, 2022, 3 pages.

* cited by examiner

ACOUSTIC WAVE DEVICE AND METHOD FOR MANUFACTURING ACOUSTIC WAVE DEVICE

CROSS REFERENCE TO RELATED APPLICATIONS

This application claims the benefit of priority to Provisional Application No. 63/168,304 filed on Mar. 31, 2021 and is a Continuation Application of PCT Application No. PCT/JP2022/016891 filed on Mar. 31, 2022. The entire contents of each application are hereby incorporated herein by reference.

BACKGROUND OF THE INVENTION

1. Field of the Invention

The present disclosure relates to an acoustic wave device including a piezoelectric layer and a method for manufacturing the acoustic wave device.

2. Description of the Related Art

In the related art, an acoustic wave device using plate waves propagating through a piezoelectric layer made of $LiNbO_3$ is known. For example, Japanese Unexamined Patent Application Publication No. 2012-257019 discloses an acoustic wave device using Lamb waves as plate waves. In the disclosure, an IDT electrode is disposed on an upper surface of a piezoelectric layer (piezoelectric substrate) made of $LiNbO_3$ or $LiTaO_3$. A voltage is applied between a plurality of electrode fingers connected to one potential of the IDT electrode and a plurality of electrode fingers connected to the other potential. As a result, Lamb waves are excited. A reflector is disposed on each side of the IDT electrode. Accordingly, an acoustic wave resonator using plate waves is provided.

In the acoustic wave device described in Japanese Unexamined Patent Application Publication No. 2012-257019, sticking may occur in which a portion of the piezoelectric film hangs down into a hollow portion and comes into contact with a support.

SUMMARY OF THE INVENTION

Preferred embodiments of the present invention provide acoustic wave devices that each eliminate or reduce sticking in which a piezoelectric film comes into contact with a support, and methods for manufacturing such acoustic wave devices.

An acoustic wave device according to a preferred embodiment of the present invention includes a support including a support substrate and an intermediate layer on the support substrate, a piezoelectric layer on or over the intermediate layer and including a through-hole, a functional electrode on the piezoelectric layer, and a hollow portion in the support substrate and the intermediate layer. At least a portion of the functional electrode overlaps the hollow portion as viewed in plan in a stacking direction of the support and the piezoelectric layer. The hollow portion includes a first hollow region and a second hollow region, the first hollow region being provided in the intermediate layer and communicating with the through-hole in the piezoelectric layer, the second hollow region being located between the first hollow region and a bottom surface of a recess in the support substrate, the recess opening toward the first hollow region.

The intermediate layer includes a portion protruding inward from a peripheral portion of the recess in the support substrate as viewed from a cross section in a thickness direction of the support.

A method for manufacturing an acoustic wave device according to a preferred embodiment of the present invention includes forming a first sacrificial layer on a piezoelectric layer, forming an intermediate layer on the piezoelectric layer and the first sacrificial layer, forming a recess in a support substrate and forming a second sacrificial layer so as to fill the recess, bonding a side of the support substrate that includes the second sacrificial layer and a side of the intermediate layer that does not include the first sacrificial layer together such that the first sacrificial layer and the second sacrificial layer at least partially overlap each other as viewed in plan view in a stacking direction of the intermediate layer and the piezoelectric layer and such that the intermediate layer includes a portion protruding inward from a peripheral portion of the recess in the support substrate as viewed from a cross section in a thickness direction of the intermediate layer, and removing the first sacrificial layer, a portion of the intermediate layer between the first sacrificial layer and the second sacrificial layer, and the second sacrificial layer by etching.

According to preferred embodiments of the present invention, it is possible to provide acoustic wave devices that each eliminate or reduce sticking in which a piezoelectric film comes into contact with a support, and methods for manufacturing such acoustic wave devices.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Acoustic wave devices according to preferred embodiments of the present invention may include a piezoelectric layer made of, for example, lithium niobate or lithium tantalate, and a first electrode and a second electrode that face each other in a direction intersecting a thickness direction of the piezoelectric layer.

In an acoustic wave device according to a preferred embodiment of the present invention, bulk waves in a first-order thickness-shear mode are generated.

In an acoustic wave device according to a preferred embodiment of the present invention, the first electrode and the second electrode are adjacent electrodes, and d/p is set to be according to a preferred embodiment of the present invention, less than or equal to about 0.5, where d is the thickness of the piezoelectric layer, and p is the center-to-center distance between the first electrode and the second electrode. With this configuration, in the first and second aspects, the Q factor can be increased even when size reduction is performed.

In the acoustic wave device according to a preferred embodiment of the present invention, Lamb waves are used as plate waves. Thus, resonance characteristics based on the Lamb waves can be obtained.

An acoustic wave device according to a preferred embodiment of the present invention includes a piezoelectric layer made of, for example, lithium niobate or lithium tantalate, and an upper electrode and a lower electrode that face each other in a thickness direction of the piezoelectric layer with the piezoelectric layer interposed therebetween, and uses bulk waves.

Acoustic wave devices according to preferred embodiments of the present invention will be described hereinafter with reference to the drawings to clarify the present disclosure.

The preferred embodiments described herein are illustrative and some of the elements in different preferred embodiments may be interchanged or combined with each other.

Preferred Embodiment 1

Figure 1A:
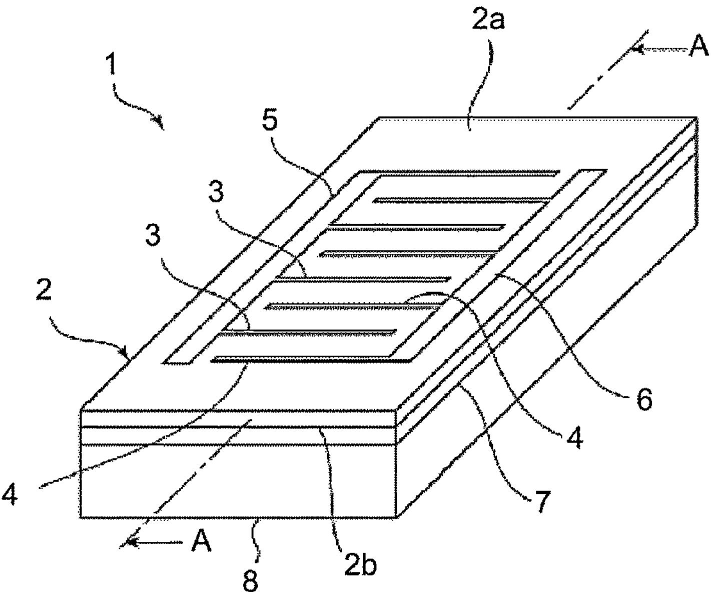
FIG. 1A is a schematic perspective view illustrating an external appearance of an acoustic wave device according to first and second aspects of preferred embodiments of the present invention.
Figure 1B:
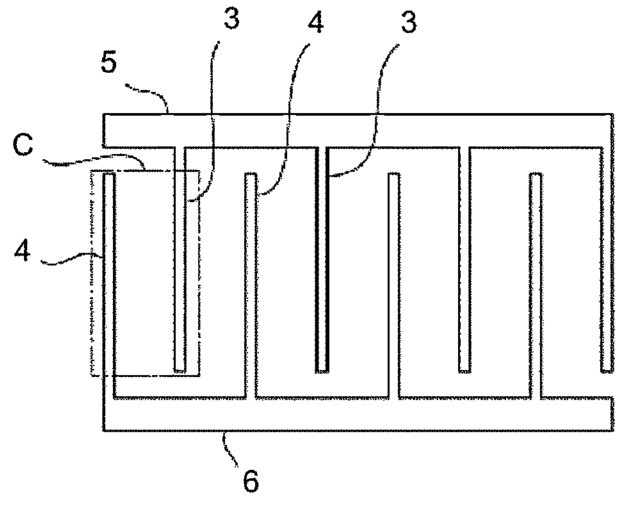
FIG. 1B is a plan view illustrating an electrode structure on a piezoelectric layer.
Figure 2:
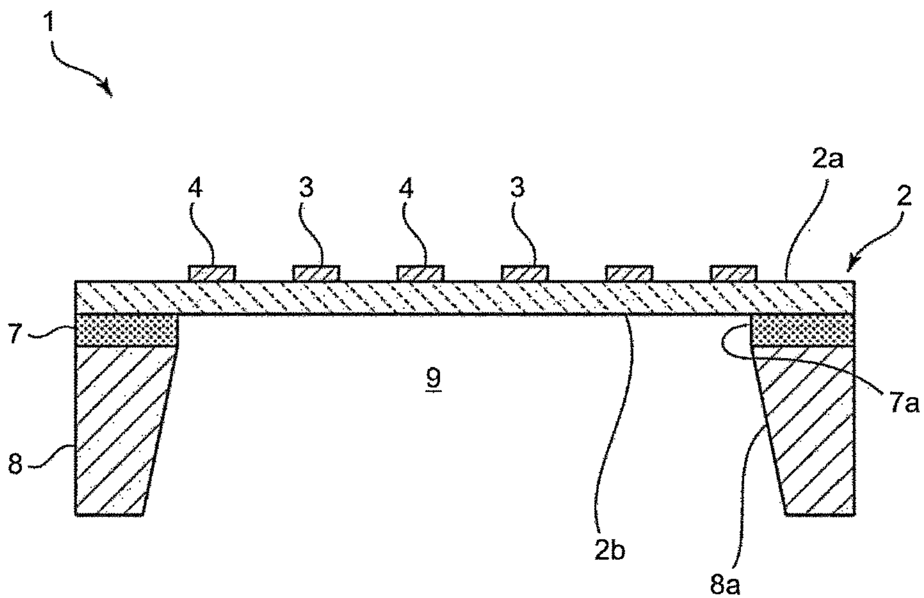
FIG. 2 is a sectional view of a portion taken along line A-A in FIG. 1A.

FIG. 1A is a schematic perspective view illustrating an external appearance of an acoustic wave device according to Preferred Embodiment 1 of the present invention. FIG. 1B is a plan view illustrating an electrode structure on a piezoelectric layer. FIG. 2 is a sectional view of a portion taken along line A-A in FIG. 1A.

An acoustic wave device 1 includes a piezoelectric layer 2 made of, for example, lithium niobate ($LiNbO_3$). The piezoelectric layer 2 may be made of, for example, lithium tantalate ($LiTaO_3$). In the present preferred embodiment, the cut angles of $LiNbO_3$ or $LiTaO_3$ are set to Z-cut. However, rotated Y-cut or X-cut may be used. Preferably, a preferred propagation orientation is Y-propagation and X-propagation of about ±30°. The thickness of the piezoelectric layer 2 is not limited, but is preferably, for example, greater than or equal to about 50 nm and less than or equal to about 1000 nm to effectively excite the first-order thickness-shear mode.

The piezoelectric layer 2 includes opposing first and second main surfaces 2*a* and 2*b*. An electrode 3 and an electrode 4 are disposed on the first main surface 2*a*. The electrode 3 is an example of a "first electrode", and the electrode 4 is an example of a "second electrode". In FIGS. 1A and 1B, a plurality of electrodes 3 are a plurality of first electrode fingers connected to a first busbar 5. A plurality of electrodes 4 are a plurality of second electrode fingers connected to a second busbar 6. The plurality of electrodes 3 interdigitate with the plurality of electrodes 4.

The electrodes 3 and the electrodes 4 have a rectangular or substantially rectangular shape and have a length direction. Each of the electrode 3 and an adjacent one of the electrodes 4 face each other in a direction orthogonal or substantially orthogonal to the length direction. The plurality of electrodes 3, the plurality of electrodes 4, the first busbar 5, and the second busbar 6 define an IDT (Interdigital Transducer) electrode. The length direction of the electrodes 3 and 4 and the direction orthogonal or substantially orthogonal to the length direction of the electrodes 3 and 4 are both a direction intersecting the thickness direction of the piezoelectric layer 2. Thus, it can be said that each of the electrodes 3 and an adjacent one of the electrodes 4 face each other in the direction intersecting the thickness direction of the piezoelectric layer 2.

The length direction of the electrodes 3 and 4 and the direction orthogonal or substantially orthogonal to the length direction of the electrodes 3 and 4 illustrated in FIGS. 1A and 1B may be interchangeable. In other words, in FIGS. 1A and 1B, the electrodes 3 and 4 may extend in a direction in which the first busbar 5 and the second busbar 6 extend. In this case, the first busbar 5 and the second busbar 6 extend in a direction in which the electrodes 3 and 4 extend in FIGS. 1A and 1B.

A plurality of pairs of structures, each pair including one of the electrodes 3 connected to one potential and an adjacent one of the electrodes 4 connected to the other potential, are disposed in the direction orthogonal or substantially orthogonal to the length direction of the electrodes 3 and 4. The expression "each of the electrodes 3 and an adjacent one of the electrodes 4" does not indicate that each of the electrodes 3 and a corresponding one of the electrodes 4 are arranged in direct contact with each other, but indicates that each of the electrodes 3 and a corresponding one of the electrodes 4 are arranged with a space therebetween.

In the case of each of the electrodes 3 and an adjacent one of the electrodes 4, an electrode to be connected to a hot electrode or a ground electrode, including the other electrodes 3 and 4, is not arranged between the adjacent electrodes 3 and 4. The number of pairs need not be an integer, but may be 1.5, 2.5, or the like. The center-to-center distance, that is, the pitch, between the electrodes 3 and 4 is preferably, for example, in a range greater than or equal to about 1 μm and less than or equal to about 10 μm. The center-to-center distance between the electrodes 3 and 4 is a distance between the center of the width dimension of the electrode 3 in the direction orthogonal or substantially orthogonal to the length direction of the electrode 3 and the center of the width dimension of the electrode 4 in the direction orthogonal or substantially orthogonal to the length direction of the electrode 4. When at least one of the number of electrodes 3 and the number of electrodes 4 is more than one (when 1.5 or more pairs of electrodes, each pair of electrodes including one of the electrodes 3 and a corresponding one of the electrodes 4, are disposed), the center-to-center distance between the electrodes 3 and 4 indicates the average value of the center-to-center distances, each of which is between adjacent electrodes 3 and 4 in one of the 1.5 or more pairs. The width of each of the electrodes 3 and 4, that is, the dimension of each of the electrodes 3 and 4 in a direction in which the electrodes 3 and 4 face each other, are preferably, for example, in a range greater than or equal to about 150 nm and less than or equal to about 1000 nm. The center-to-center distance between the electrodes 3 and 4 is a distance between the center of the dimension (width dimension) of the electrode 3 in the direction orthogonal or substantially orthogonal to the length direction of the electrode 3 and the center of the dimension (width dimension) of the electrode 4 in the direction orthogonal or substantially orthogonal to the length direction of the electrode 4.

In the present preferred embodiment, since a Z-cut piezoelectric layer is used, the direction orthogonal or substantially orthogonal to the length direction of the electrodes 3 and 4 is a direction orthogonal or substantially orthogonal to the polarization direction of the piezoelectric layer 2. This is not the case when a piezoelectric material having different cut angles is used as the piezoelectric layer 2. As used here, the term "orthogonal" is not limited to exactly orthogonal, but may mean substantially orthogonal (for example, an angle of about 90°±10° between the direction orthogonal to the length direction of the electrodes 3 and 4 and the polarization direction).

A support 8 is stacked on the second main surface 2*b* of the piezoelectric layer 2 with an insulating layer 7 interposed therebetween. The insulating layer 7 and the support 8 have a frame shape. As illustrated in FIG. 2, the insulating layer 7 and the support 8 include cavities 7*a* and 8*a*, respectively. As a result, a hollow portion 9 is provided. The hollow portion 9 is provided not to interfere with the vibration of an excitation region C of the piezoelectric layer 2. Accordingly, the support 8 is stacked on the second main surface 2*b*, with the insulating layer 7 interposed therebetween, at a position at which the support 8 does not overlap a portion where at least one pair of electrodes 3 and 4 is disposed. The insulating layer 7 is optional. Thus, the support 8 can be stacked directly or indirectly on the second main surface 2*b* of the piezoelectric layer 2.

The insulating layer 7 is made of, for example, silicon oxide. Instead of silicon oxide, any other appropriate insulating material such as, for example, silicon oxynitride or alumina can be used. The support 8 is made of, for example, Si. The plane orientation on a surface of Si near the piezoelectric layer 2 may be (100) or (110) or may be (111). Preferably, high-resistance Si having, for example, a resistivity greater than or equal to about 4 kΩ is desirable. However, the support 8 can also be made using an appropriate insulating material or semiconductor material. Examples of the material of the support 8 can include piezoelectrics such as aluminum oxide, lithium tantalate, lithium niobate, and quartz, various ceramics such as alumina, magnesia, sapphire, silicon nitride, aluminum nitride, silicon carbide, zirconia, cordierite, mullite, steatite, and forsterite, dielectrics such as diamond and glass, and semiconductors such as gallium nitride.

The plurality of electrodes 3, the plurality of electrodes 4, and the first and second busbars 5 and 6 are made of an appropriate metal or alloy such as, for example, Al or an AlCu alloy. In the present preferred embodiment, the electrodes 3 and 4 and the first and second busbars 5 and 6 have a structure in which, for example, an Al film is stacked on a Ti film. A contact layer other than a Ti film may be used.

During driving, an alternating-current voltage is applied between the plurality of electrodes 3 and the plurality of electrodes 4. More specifically, an alternating-current voltage is applied between the first busbar 5 and the second busbar 6. As a result, it is possible to provide resonance characteristics using bulk waves in a first-order thickness-shear mode excited in the piezoelectric layer 2.

The acoustic wave device 1 is designed such that d/p is, for example, less than or equal to about 0.5, where d is the thickness of the piezoelectric layer 2 and p is the center-to-center distance between adjacent electrodes 3 and 4 in one of the plurality of pairs of electrodes 3 and 4. As a result, bulk waves in a first-order thickness-shear mode are effectively excited, which can provide good resonance characteristics. More preferably, d/p is, for example, less than or equal to about 0.24. In this case, even better resonance characteristics can be provided.

As in the present preferred embodiment, when at least one of the number of electrodes 3 and the number of electrodes 4 is more than one, that is, when 1.5 or more pairs of electrodes 3 and 4, each pair including one of the electrodes 3 and a corresponding one of the electrodes 4, are disposed, the center-to-center distance p between adjacent electrodes 3 and 4 is the average distance of the center-to-center distances between the adjacent electrodes 3 and 4 in the respective pairs.

With the configuration described above, in the acoustic wave device 1 according to the present preferred embodiment, the Q factor is less likely to decrease even when the number of pairs of electrodes 3 and 4 is reduced to achieve size reduction. This is because the resulting resonator does not require a reflector on each side thereof and thus has a small propagation loss. The reflectors described above are not required because bulk waves in a first-order thickness-shear mode are used.

The difference between Lamb waves used in an existing acoustic wave device and bulk waves in a first-order thickness-shear mode will be described with reference to FIGS. 3A and 3B.

Figure 3A:
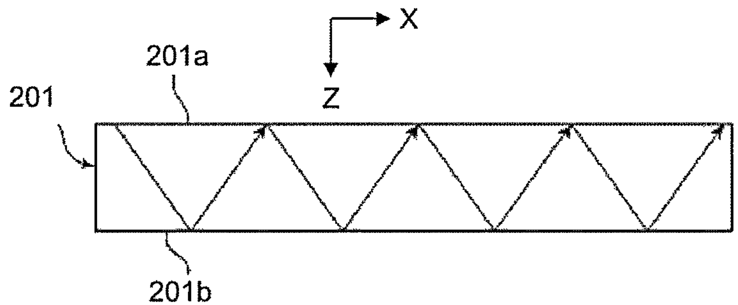
FIG. 3A is a schematic elevational cross-sectional view illustrating Lamb waves propagating through a piezoelectric film of an existing acoustic wave device.

FIG. 3A is a schematic elevational cross-sectional view illustrating Lamb waves propagating through a piezoelectric film of an existing acoustic wave device. The existing acoustic wave device is described in, for example, Japanese Unexamined Patent Application Publication No. 2012-257019. As illustrated in FIG. 3A, in the existing acoustic wave device, waves propagate through a piezoelectric film 201 in a manner as indicated by arrows. The piezoelectric film 201 includes a first main surface 201*a* and a second main surface 201*b* that face each other, and a thickness direction connecting the first main surface 201*a* and the second main surface 201*b* is the Z direction. The X direction refers to a direction in which electrode fingers of an IDT electrode are arranged. As illustrated in FIG. 3A, Lamb waves propagate in the X direction in the illustrated manner. The piezoelectric film 201 vibrates as a whole because the waves are plate waves. However, since the waves propagate in the X direction, a reflector is disposed on each side to provide resonance characteristics. This results in wave propagation loss. If size reduction is performed, that is, if the number of pairs of electrode fingers is reduced, the Q factor decreases.

Figure 3B:
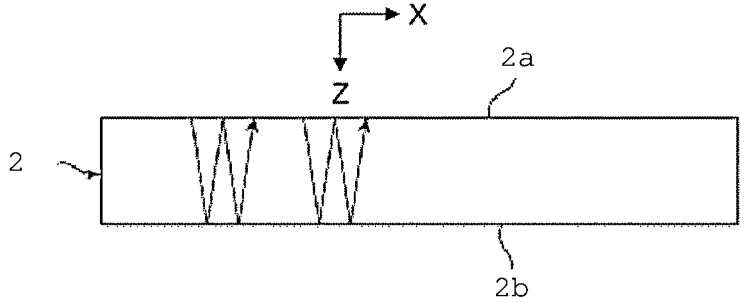
FIG. 3B is a schematic elevational cross-sectional view illustrating waves of an acoustic wave device according to a preferred embodiment of the present invention.

In the acoustic wave device 1 according to the present preferred embodiment, in contrast, as illustrated in FIG. 3B, vibration displacement occurs in a thickness-shear direction. Thus, the waves propagate substantially in a direction connecting the first main surface 2*a* and the second main surface 2*b* of the piezoelectric layer 2, that is, in the Z direction, to achieve resonance. That is, the waves have a significantly smaller X-direction component than a Z-direction component thereof. Since the wave propagation in the Z direction provides the resonance characteristics, no reflector is required. Accordingly, no propagation loss due to propagation through a reflector occurs. As a result, the Q factor is less likely to decrease even when the number of electrode pairs including the electrodes 3 and 4 is reduced to perform size reduction.

Figure 4:
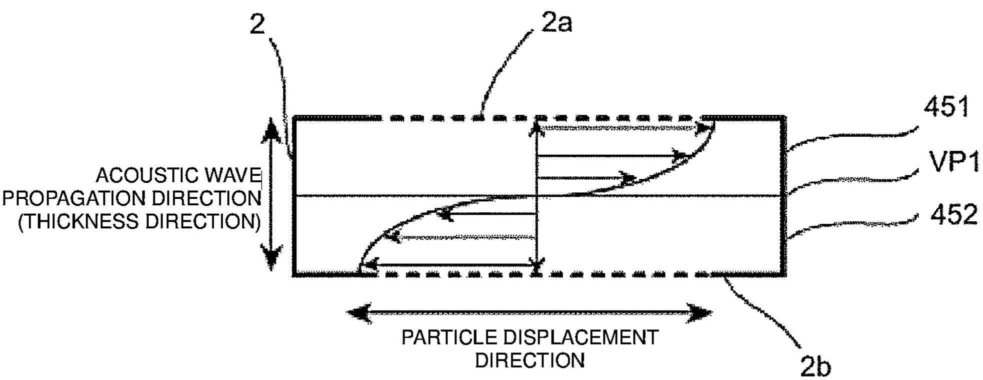
FIG. 4 is a schematic view illustrating bulk waves produced when a voltage is applied between a first electrode and a second electrode such that the second electrode is at a higher potential than the first electrode.

As illustrated in FIG. 4, the amplitude directions of bulk waves in a first-order thickness-shear mode are opposite between a first region 451 included in the excitation region C of the piezoelectric layer 2 and a second region 452 included in the excitation region C. FIG. 4 schematically illustrates bulk waves produced when a voltage is applied between the electrode 3 and the electrode 4 such that the electrode 4 is at a higher potential than the electrode 3. The first region 451 is a region of the excitation region C located between a virtual plane VP1 and the first main surface 2*a*. The virtual plane VP1 is orthogonal or substantially orthogonal to the thickness direction of the piezoelectric layer 2 and divides the piezoelectric layer 2 into two regions. The second region 452 is a region of the excitation region C located between the virtual plane VP1 and the second main surface 2*b*.

In the acoustic wave device 1, as described above, at least one pair of electrodes including an electrode 3 and an electrode 4 is disposed. Since the acoustic wave device 1 is not designed for wave propagation in the X direction, the acoustic wave device 1 does not necessarily need to include a plurality of electrode pairs including the electrodes 3 and 4. That is, the acoustic wave device 1 may simply include at least one pair of electrodes.

For example, the electrode 3 is an electrode connected to a hot potential, and the electrode 4 is an electrode connected to a ground potential. However, the electrode 3 may be connected to a ground potential, and the electrode 4 may be connected to a hot potential. In the present preferred embodiment, as described above, at least one pair of electrodes includes an electrode connected to a hot potential or an electrode connected to a ground potential, and does not include a floating electrode.

Figure 5:
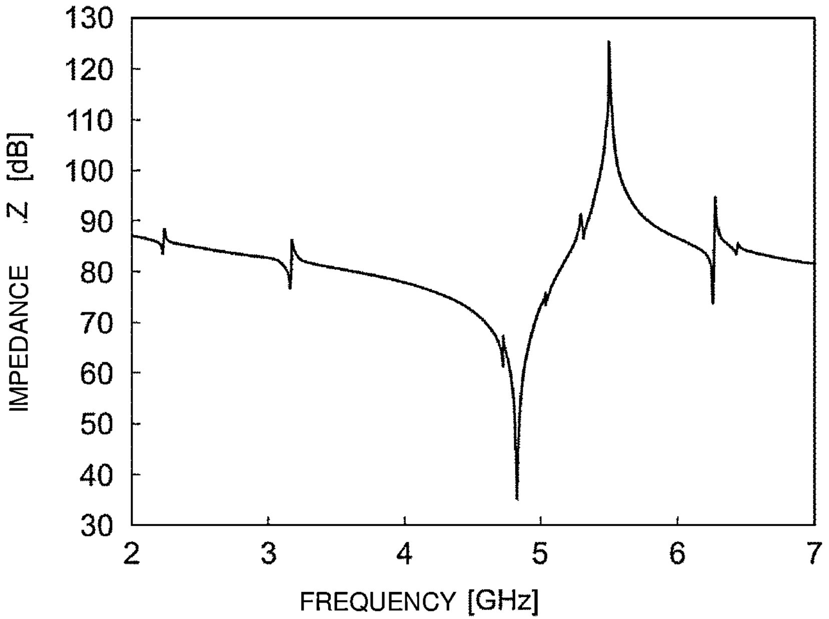
FIG. 5 is a diagram illustrating resonance characteristics of an acoustic wave device according to Preferred Embodiment 1 of the present invention.

FIG. 5 illustrates resonance characteristics of the acoustic wave device according to Preferred Embodiment 1 of the present invention. The acoustic wave device 1 with the resonance characteristics has design parameters as follows.

Piezoelectric layer 2: $LiNbO_3$ having Euler angles (0°, 0°, 90°), with a thickness of about 400 nm. The length of a region where the electrode 3 and the electrode 4 overlap when viewed in the direction orthogonal or substantially orthogonal to the length direction of the electrode 3 and the electrode 4, that is, the excitation region C, is about 40 μm, the number of pairs of electrodes, each including the electrodes 3 and 4, is 21, the center-to-center distance between electrodes is about 3 μm, and the width of the electrodes 3 and 4 is about 500 nm, and d/p is about 0.133.

Insulating layer 7: silicon oxide film having a thickness of about 1 μm.

Support 8: Si.

The length of the excitation region C is a dimension of the excitation region C in the length direction of the electrodes 3 and 4.

In the present preferred embodiment, all of the distances between electrodes in a plurality of electrode pairs including the electrodes 3 and 4 are set to be equal or substantially equal. That is, the electrodes 3 and the electrodes 4 are disposed at equal or substantially equal pitches.

As is clear from FIG. 5, good resonance characteristics with a fractional bandwidth of, for example, about 12.5% are obtained, even though no reflector is disposed.

In the present preferred embodiment, when the thickness of the piezoelectric layer 2 is represented by d and the center-to-center distance between electrodes including the electrode 3 and the electrode 4 is represented by p, as described above, d/p is, for example, less than or equal to about 0.5, and more preferably less than or equal to about 0.24. This will be described with reference to FIG. 6.

Figure 6:
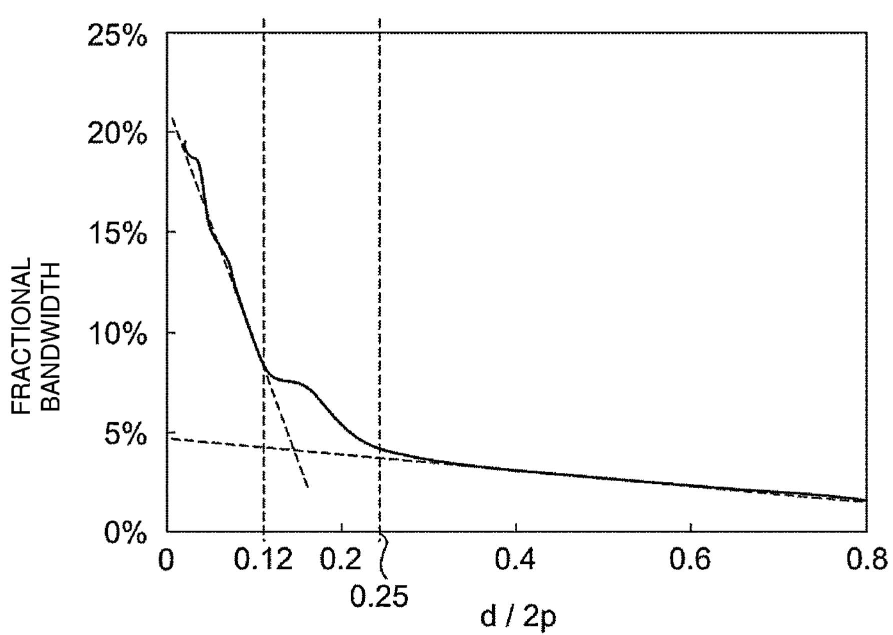
FIG. 6 is a diagram illustrating the relationship between d/2p and a fractional bandwidth of a resonator of the acoustic wave device according to Preferred Embodiment 1 of the present invention.

A plurality of acoustic wave devices are obtained in a manner similar to that of the acoustic wave device having the resonance characteristics illustrated in FIG. 5, except that d/2p is changed. FIG. 6 is a diagram illustrating the relationship between d/2p and the fractional bandwidth of a resonator of the acoustic wave device.

As is clear from FIG. 6, when d/2p exceeds, for example, about 0.25, that is, d/p>about 0.5, the fractional bandwidth remains less than about 5% even if d/p is adjusted. When d/2p≤about 0.25, that is, d/p≤about 0.5, in contrast, changing d/p within this range makes it possible to provide a fractional bandwidth of greater than or equal to about 5%. That is, a resonator having a high coupling coefficient can be provided. When d/2p is, for example, less than or equal to about 0.12, that is, when d/p is less than or equal to about 0.24, the fractional bandwidth can be increased to be greater than or equal to about 7%. In addition, adjusting d/p within this range makes it possible to provide a resonator having a wider fractional bandwidth. Thus, a resonator having an even higher coupling coefficient can be achieved. It can therefore be appreciated that, as in an acoustic wave device according to a preferred embodiment of the present invention, setting d/p to be, for example, less than or equal to about 0.5 makes it possible to provide a resonator having a high coupling coefficient that uses bulk waves in a first-order thickness-shear mode.

As described above, at least one pair of electrodes may be one pair. When one pair of electrodes is used, p is the center-to-center distance of the adjacent electrodes 3 and 4. When 1.5 or more pairs of electrodes are used, the average distance of the center-to-center distances of adjacent electrodes 3 and 4 is desirably represented by p.

Further, when the piezoelectric layer 2 generates variations in thickness, a value of the averaged thickness may be used as the thickness d of the piezoelectric layer.

Figure 7:
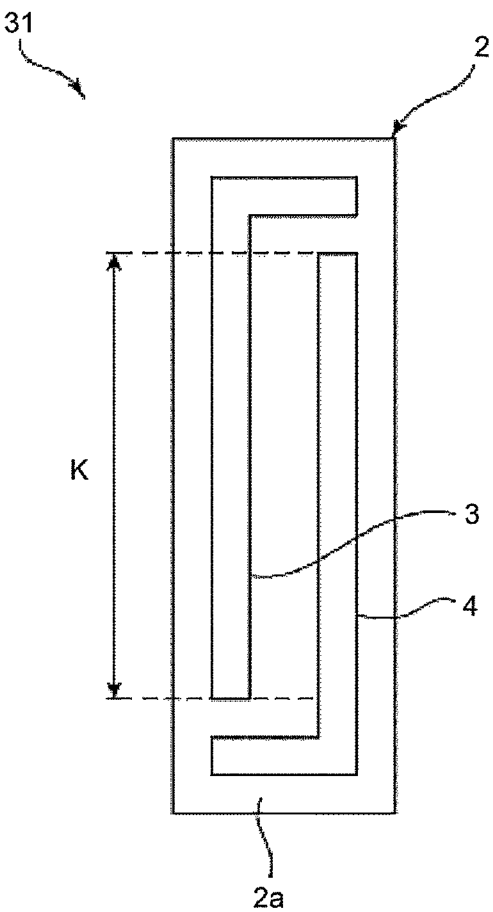
FIG. 7 is a plan view of another acoustic wave device according to Preferred Embodiment 1 of the present invention.

FIG. 7 is a plan view of another acoustic wave device according to Preferred Embodiment 1 of the present invention. In an acoustic wave device 31, a pair of electrodes 3 and 4 is disposed on the first main surface 2*a* of the piezoelectric layer 2. In FIG. 7, K represents an intersecting width. As described above, the acoustic wave device 31 according to the present preferred embodiment may include one pair of electrodes. Also in this case, setting d/p, described above, to be, for example, less than or equal to about 0.5 makes it possible to effectively excite bulk waves in a first-order thickness-shear mode.

In the acoustic wave device 1, an excitation region is a region in which any adjacent electrodes 3 and 4 among the plurality of electrodes 3 and the plurality of electrodes 4 overlap each other when viewed in a direction in which the adjacent electrodes 3 and 4 face each other, and, preferably, for example, a metallization ratio MR of the adjacent electrodes 3 and 4 with respect to the excitation region satisfies MR≤about 1.75 (d/p)+0.075. That is, a region in which adjacent electrodes 3 and 4 overlap each other when viewed in a direction in which electrodes 3 and the second electrode fingers 4 are arranged is an excitation region, and MR≤about 1.75 (d/p)+0.075 is preferably satisfied, where MR is the metallization ratio of the pluralities of electrodes 3 and 4 with respect to the excitation region. In this case, spurious components can be effectively reduced in magnitude.

Figure 8:
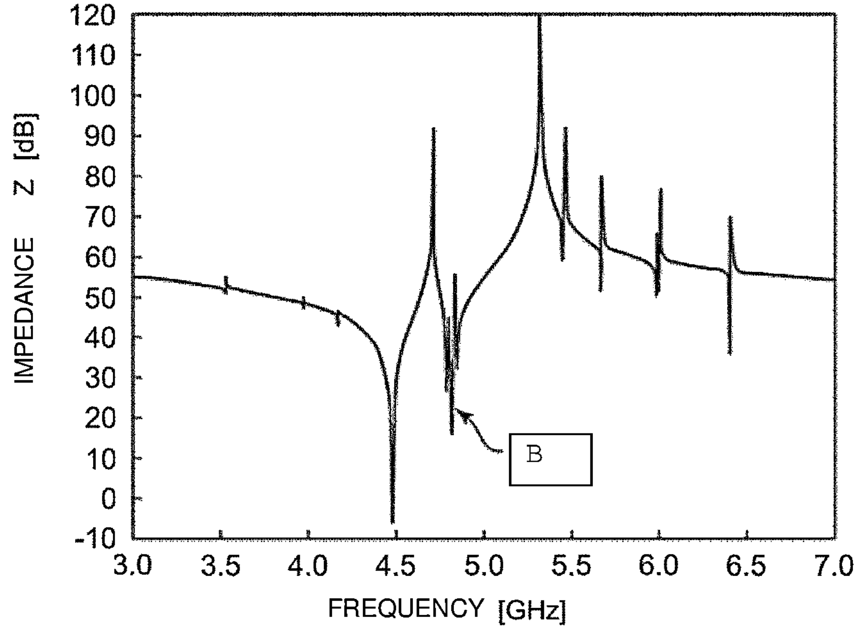
FIG. 8 is a reference diagram illustrating an example of resonance characteristics of the acoustic wave device according to Preferred Embodiment 1 of the present invention.

This will be described with reference to FIG. 8 and FIG. 9. FIG. 8 is a reference diagram illustrating an example of the resonance characteristics of the acoustic wave device 1 described above. Spurious components indicated by arrow B appear between the resonant frequency and the anti-resonant frequency. It is assumed that, for example, d/p is about 0.08 and the Euler angles of $LiNbO_3$ are (0°, 0°, 90°). It is also assumed that, for example, the metallization ratio MR described above is about 0.35.

The metallization ratio MR will be described with reference to FIG. 1B. In the electrode structure illustrated in FIG. 1B, a focus is placed on a pair of electrodes 3 and 4. In this case, it is assumed that only this pair of electrodes 3 and 4 is provided. In this case, a portion surrounded by an alternate long and short dash line C is an excitation region. The excitation region is a region of the electrode 3 that overlaps the electrode 4, a region of the electrode 4 that overlaps the electrode 3, and a region where the electrode 3 and the electrode 4 overlap each other within a region between the electrode 3 and the electrode 4 when the electrode 3 and the electrode 4 are viewed in the direction orthogonal or substantially orthogonal to the length direction of the electrodes 3 and 4, that is, in an opposing direction. The area of the electrodes 3 and 4 in the excitation region C with respect to the area of the excitation region is the metallization ratio MR. That is, the metallization ratio MR is the ratio of the area of the metallization portion to the area of the excitation region.

When a plurality of pairs of electrodes are provided, the ratio of the metallization portions included in all of the excitation regions to the sum of the areas of the excitation regions is preferably represented by MR.

Figure 9:
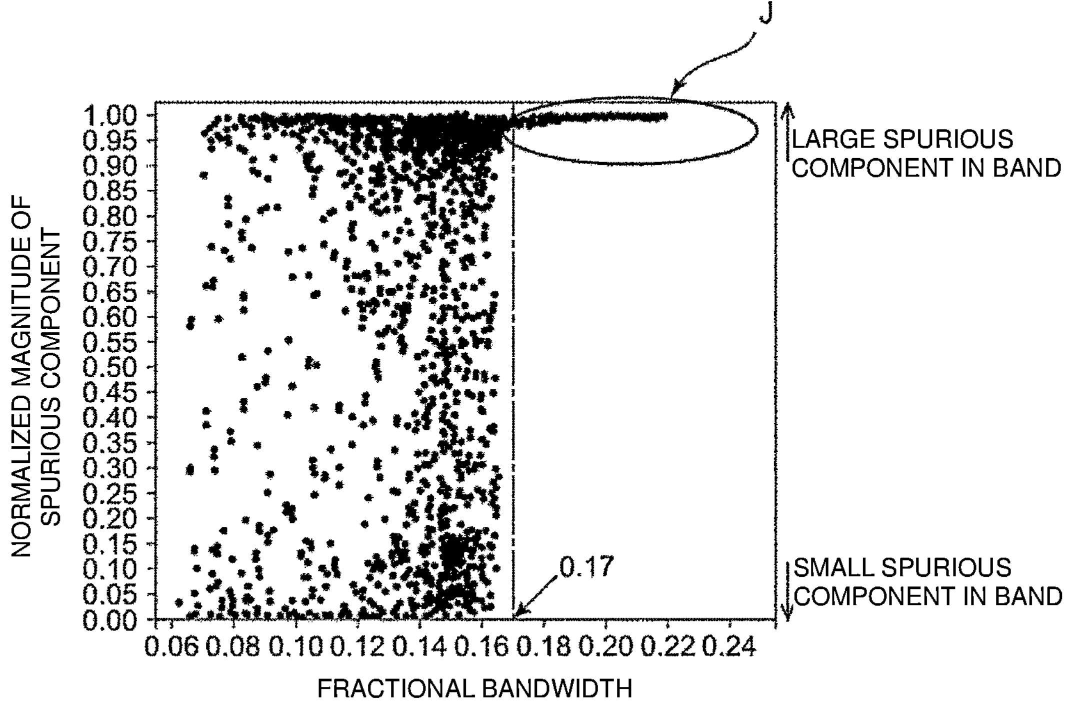
FIG. 9 is a diagram illustrating the relationship between a fractional bandwidth and the amount of phase rotation of the impedance of spurious components, which is used as the magnitude of the spurious components and normalized by about 180 degrees, when a large number of acoustic wave resonators are provided.

FIG. 9 is a diagram illustrating the relationship between a fractional bandwidth and the amount of phase rotation of the impedance of spurious components, which is used as the magnitude of the spurious components and normalized by about 180 degrees, when a large number of acoustic wave resonators are provided according to the present preferred embodiment. The fractional bandwidth is adjusted by variously changing the film thickness of the piezoelectric layer and the dimensions of the electrodes. FIG. 9 illustrates results obtained when a piezoelectric layer made of, for example, Z-cut $LiNbO_3$ is used. Also in a case where a piezoelectric layer having other cut angles is used, a similar tendency is obtained.

In a region surrounded by an ellipse J in FIG. 9, the magnitude of spurious components is as large as about 1.0. As is clear from FIG. 9, when the fractional bandwidth exceeds about 0.17, that is, when the fractional bandwidth exceeds about 17%, large spurious components with a spurious level of greater than or equal to about 1 appear in the pass band even when the parameters for forming the fractional bandwidth are changed. That is, as in the resonance characteristics illustrated in FIG. 8, large spurious components indicated by arrow B appear in the band. Therefore, the fractional bandwidth is preferably, for example, less than or equal to about 17%. In this case, spurious components can be reduced by adjusting, for example, the film thickness of the piezoelectric layer 2 and the dimensions of the electrodes 3 and 4.

Figure 10:
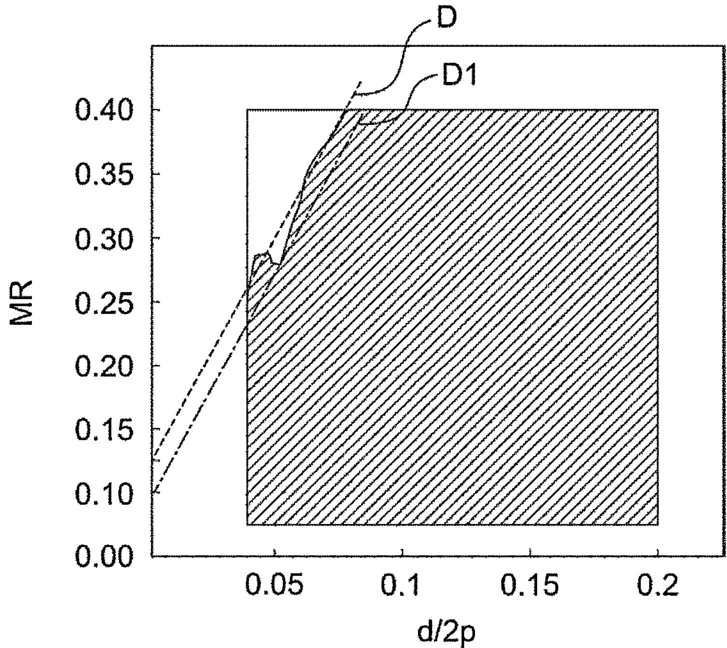
FIG. 10 is a diagram illustrating the relationship between d/2p, a metallization ratio MR, and the fractional bandwidth.

FIG. 10 is a diagram illustrating the relationship between d/2p, the metallization ratio MR, and the fractional bandwidth. In the acoustic wave device described above, the values of d/2p and MR are made different to provide various acoustic wave devices, and the fractional bandwidths are measured. In FIG. 10, a hatched portion to the right of a broken line D represents a region having a fractional bandwidth of less than or equal to about 17%. The boundary between the hatched region and a non-hatched region is represented by MR=about 3.5(d/2p)+0.075. That is, MR=about 1.75(d/p)+0.075. Accordingly, preferably, for example, MR≤about 1.75 (d/p)+0.075. In this case, a fractional bandwidth of less than or equal to about 17% is likely to be obtained. A more preferable example of the region described above is a region to the right of an alternate long and short dash line D1 in FIG. 10, which represents MR=about 3.5 (d/2p)+0.05. That is, setting MR≤about 1.75 (d/p)+0.05 ensures that a fractional bandwidth of less than or equal to about 17% can be obtained.

Figure 11:
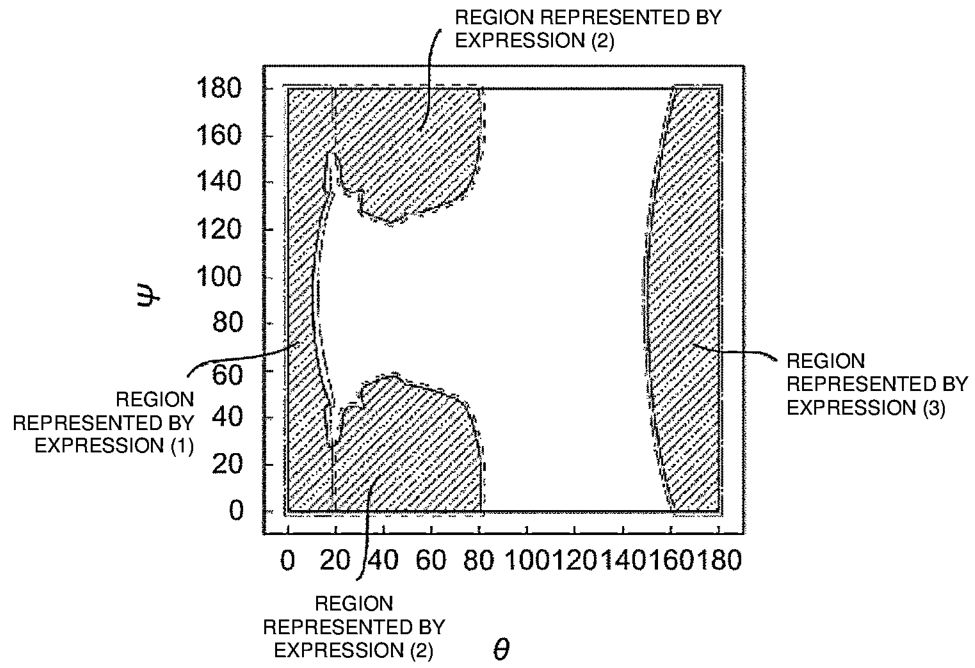
FIG. 11 is a diagram illustrating a map of the fractional bandwidth with respect to the Euler angles (0°, θ, ψ) of $LiNbO_3$ when d/p is set as close to zero as possible.

FIG. 11 is a diagram illustrating a map of the fractional bandwidth with respect to the Euler angles (0°, θ, ψ) of $LiNbO_3$ when d/p is set as close to zero as possible. In FIG. 11, hatched portions represent regions where a fractional bandwidth of at least greater than or equal to 5% is obtained. The ranges of the regions are approximated to provide ranges represented by Expression (1), Expression (2), and Expression (3) below.

$$0°\pm10°, 0° \text{ to } 20°, \text{ any } \psi \quad \text{Expression (1)}$$

$$(0°\pm10°, 20° \text{ to } 80°, 0° \text{ to } 60°(1-(\theta-50)^2/900)^{1/2}) \text{ or } (0°\pm10°, 20° \text{ to } 80°, [180°-60°(1-(\theta-50)^2/900)^{1/2}] \text{ to } 180°) \quad \text{Expression (2)}$$

$$(0°\pm10°, [180°-30°(1-(\psi-90)^2/8100)^{1/2}] \text{ to } 180°, \text{ any } \psi) \quad \text{Expression (3)}$$

Accordingly, the Euler angle range represented by Expression (1), Expression (2), or Expression (3) above is preferable since a sufficient large fractional bandwidth can be obtained.

Figure 12:
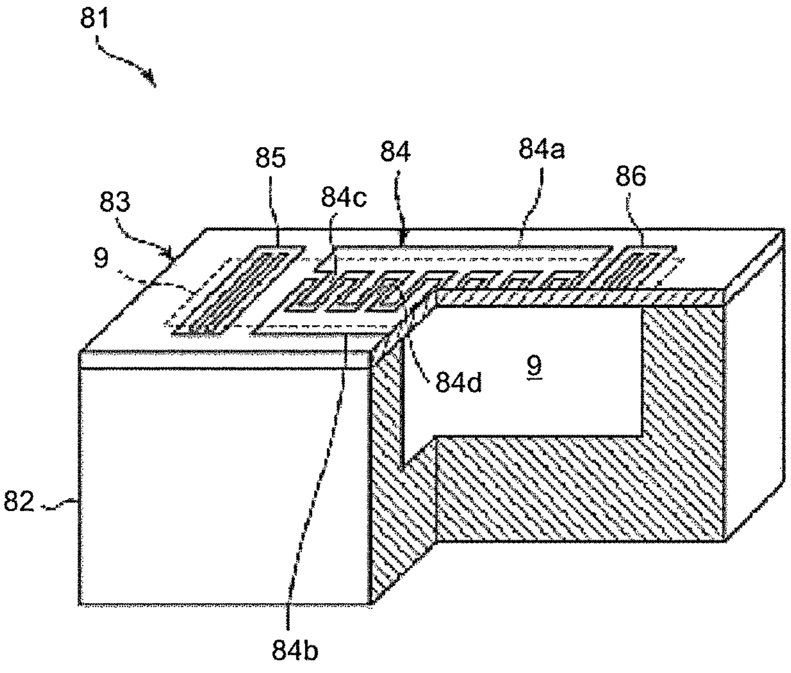
FIG. 12 is a partially cutaway perspective view illustrating an acoustic wave device according to Preferred Embodiment 1 of the present invention.

FIG. 12 is a partially cutaway perspective view illustrating the acoustic wave device according to Preferred Embodiment 1 of the present invention. An acoustic wave device 81 includes a support substrate 82. The support substrate 82 includes an open recess in an upper surface thereof. A piezoelectric layer 83 is stacked on the support substrate 82. As a result, a hollow portion 9 is provided. An IDT electrode 84 is disposed on the piezoelectric layer 83 above the hollow portion 9. Reflectors 85 and 86 are disposed on both sides of the IDT electrode 84 in the acoustic wave propagation direction. In FIG. 12, the outer perimeter of the hollow portion 9 is indicated by a broken line. The IDT electrode 84 includes first and second busbars **84*a* and 84*b*, a plurality of electrodes 84*c* defining and functioning as first electrode fingers, and a plurality of electrodes 84*d* defining and functioning as second electrode fingers. The plurality of electrodes 84*c* are connected to the first busbar 84*a*. The plurality of electrodes 84*d* are connected to the second busbar 84*b*. The plurality of electrodes 84*c* interdigitate with the plurality of electrodes 84*d***.

In the acoustic wave device 81, an alternating-current electric field is applied to the IDT electrode 84 above the hollow portion 9. As a result, Lamb waves serving as plate waves are excited. Since the reflectors 85 and 86 are disposed on both sides, the resonance characteristics based on the Lamb waves described above can be obtained.

As described above, the acoustic wave device according to the present disclosure may use plate waves.

Preferred Embodiment 2

An acoustic wave device according to Preferred Embodiment 2 of the present invention will be described hereinafter.

Figure 13:
FIG. 13 is a schematic sectional view of an acoustic wave device according to a comparative example.
Figure 13:
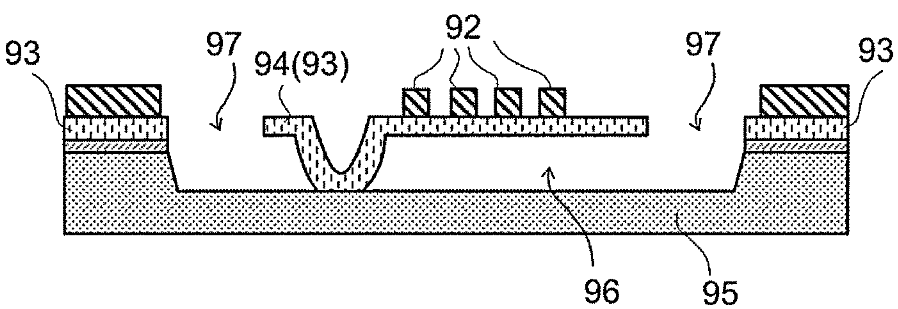

First, problems to be overcome by the acoustic wave device according to Preferred Embodiment 2 will be described. FIG. 13 is a schematic sectional view of an acoustic wave device 91 according to a comparative example. In the case of the acoustic wave device 91 according to the comparative example, a sticking phenomenon may occur in which a membrane portion 94, which is a portion of a piezoelectric layer 93 on which a functional electrode 92 is disposed, bends and sticks to a support substrate 95 located therebelow. Since the membrane portion 94 is disposed over a hollow portion 96 and is partially separated from the piezoelectric layer 93 on the support substrate 95 by through-holes 97, the membrane portion 94 is easily bent. In Preferred Embodiment 2, an acoustic wave device 100 that has overcome this problem will be described.

In the description of Preferred Embodiment 2, elements having configurations, operations, and functions the same as or similar to those in Preferred Embodiment 1 will not be described to avoid redundant description, and differences will be mainly described hereinafter.

Figure 14:
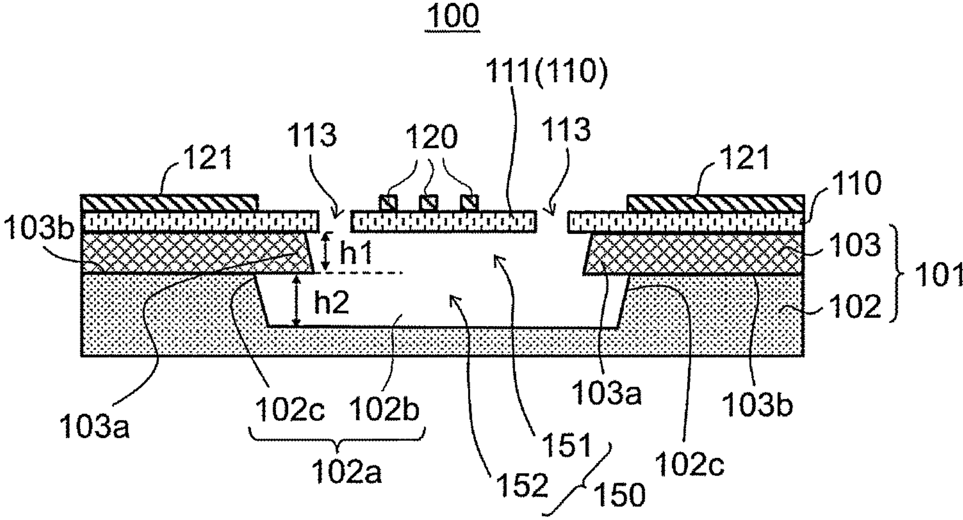
FIG. 14 is a schematic sectional view of an acoustic wave device according to a second preferred embodiment of the present invention.
Figure 15:
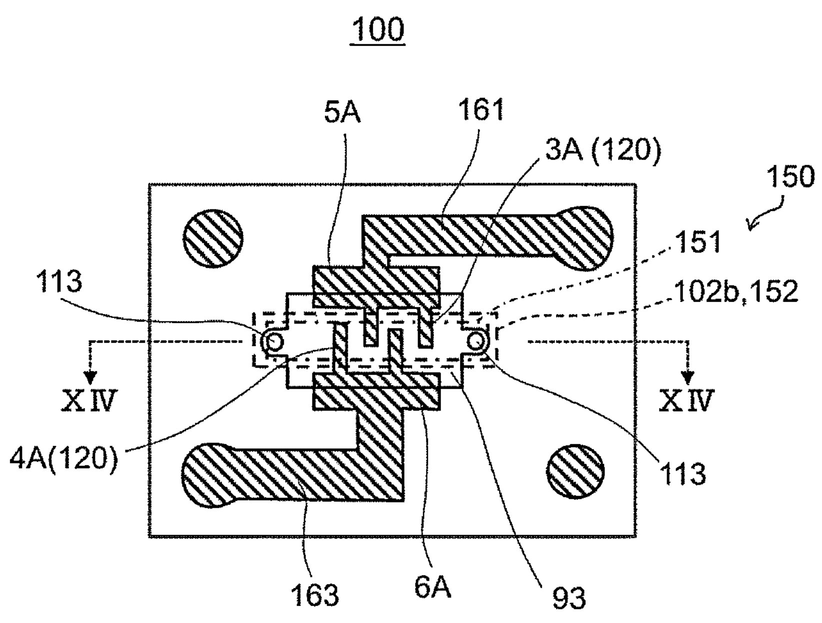
FIG. 15 is a plan view of the acoustic wave device according to the second preferred embodiment of the present invention.

Reference is made to FIG. 14 and FIG. 15. FIG. 14 is a schematic sectional view of the acoustic wave device 100 according to Preferred Embodiment 2, taken along line XIV-XIV in FIG. 15. FIG. 15 is a plan view of the acoustic wave device 100 according to Preferred Embodiment 2. The term "in plan view" means as viewed in the thickness direction of the acoustic wave device 100, that is, as viewed in the stacking direction of a support 101 and a piezoelectric layer 110.

As illustrated in FIG. 14, the acoustic wave device 100 includes the support 101, the piezoelectric layer 110, a functional electrode 120, and a hollow portion 150.

The support 101 includes a support substrate 102 and an intermediate layer 103. For example, the support 101 includes a multilayer body including the support substrate 102 made of, for example, Si and the intermediate layer 103 stacked on the support substrate 102 and made of, for example, SiOx. The side of the support substrate 102 near the piezoelectric layer 110 is recessed to provide a recess **102*a***.

The piezoelectric layer 110 is made of, for example, lithium niobate or lithium tantalate. As used herein, a portion of the piezoelectric layer 110 located in a region overlapping a first hollow region 151 as viewed in plan is referred to as a membrane portion 111.

At least portions of the functional electrode 120 overlap the hollow portion 150 as viewed in plan view in the stacking direction of the support substrate 102 and the piezoelectric layer 110.

The support 101 includes, in the support substrate 102 and the intermediate layer 103, the hollow portion 150 that opens toward the piezoelectric layer 110. The hollow portion 150 is provided between the support 101 and the piezoelectric layer 110. The hollow portion 150 is a space defined by the support 101 and the piezoelectric layer 110. The hollow portion 150 includes a first hollow region 151 and a second hollow region 152, each of which is a space. The first hollow region 151 is provided in the intermediate layer 103, and the second hollow region 152 is provided in the support substrate 102 and is defined by the recess **102*a*. The first hollow region 151 and the second hollow region 152** communicate with each other.

The intermediate layer 103 includes a protruding portion **103*a* that protrudes inward (toward the hollow portion 150) from a peripheral portion 102*c* of the recess 102*a* in the support substrate 102 as viewed from a cross section in the thickness direction of the support 101. Accordingly, the intermediate layer 103 includes a bottom surface 103***b* that is more convex toward the hollow portion 150 than the inner wall of the support substrate 102 on the hollow portion 150 side. In other words, the inner wall of the intermediate layer 103 on the hollow portion 150 side is more inward than the inner wall of the support substrate 102 on the hollow portion 150 side.

As a result, in the hollow portion 150, the area of the first hollow region 151, which is relatively close to the piezoelectric layer 110, as viewed in plan is smaller than the area of the second hollow region 152, which is relatively far from the piezoelectric layer 110, as viewed in plan view. This makes it easy to reduce the area of a portion of the hollow portion 150 that overlaps the functional electrode 120 as viewed in plan view, and makes it easy to reduce or prevent bending of the piezoelectric layer 110 toward the hollow portion 150.

In addition, reducing the area of a portion of the hollow portion 150 that overlaps the functional electrode 120 as viewed in plan view also makes it easy to reduce or prevent variations in the film thickness of the piezoelectric layer 110. Further, according to the present preferred embodiment, even if the piezoelectric layer 110 is bent, the distance between the piezoelectric layer 110 and a bottom surface 102*b* of the recess 102*a* in the support substrate 102 is large due to the presence of the second hollow region 152 of the hollow portion 150. Thus, the sticking of the membrane portion 111 of the piezoelectric layer 110 to the support substrate 102 can further be reduced or prevented.

As viewed in plan view, the area of the recess 102*a* in the support substrate 102 is larger than the area of the first hollow region 151. As viewed in plan view, the area of the second hollow region 152 may be larger than the area of the first hollow region 151. This ensures that the hollow portion 150 can be provided even if the first hollow region 151 and the second hollow region 152 are misaligned during manufacturing of the acoustic wave device 1. The area of the first hollow region 151 may be equal or substantially equal to the area of the second hollow region 152.

Further, a depth h2 of the second hollow region 152, which is the depth from the bottom surface 103*b* of the intermediate layer 103 to the bottom surface 102*b* of the recess 102*a* in the support substrate 102, is larger than a depth h1 of the first hollow region 151, which is the depth from the rear surface of the piezoelectric layer 110 to the bottom surface 103*b* of the intermediate layer 103. This further ensures that the sticking of the membrane portion 111 can be eliminated or reduced. The depth h1 of the first hollow region 151 may be equal or substantially equal to the depth h2 of the second hollow region 152.

Figure 16:
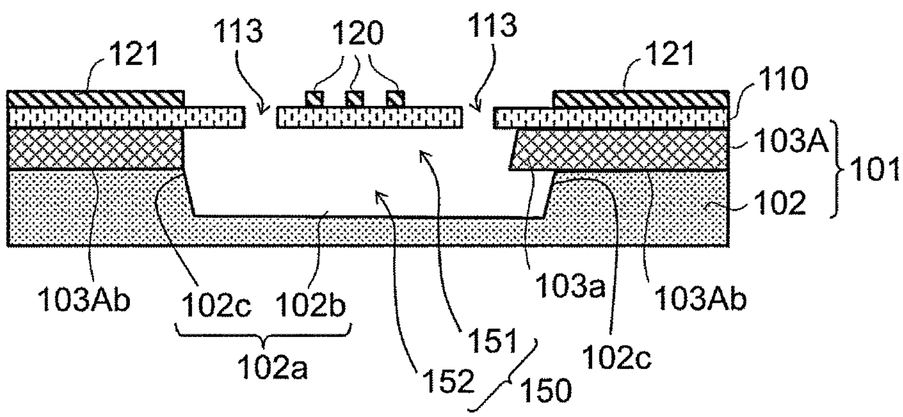
FIG. 16 is a schematic sectional view of an acoustic wave device according to a modification of a preferred embodiment of the present invention.
Figure 17:
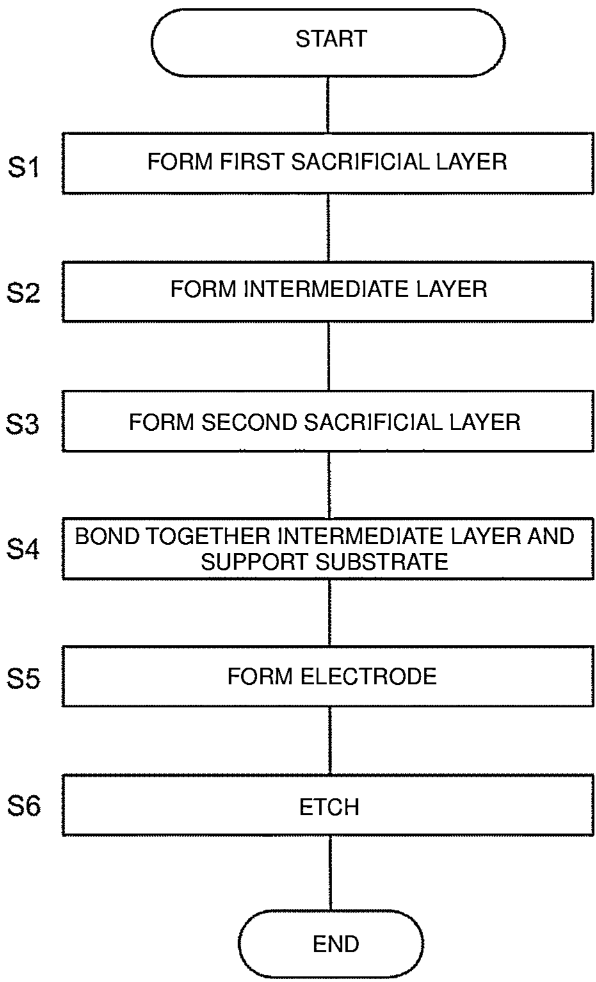
FIG. 17 is a flowchart illustrating a flow of manufacturing an acoustic wave device according to a preferred embodiment of the present invention.

Both of the portions of the bottom surface 103*b* of the intermediate layer 103, which are located on both sides of the peripheral portion 102*c* of the support substrate 102 as viewed in the cross section illustrated in FIG. 14, need not protrude toward the hollow portion 150 from the sidewall of the recess 102*a* in the support substrate 102. As in an acoustic wave device 100A according to Modification 1 of Preferred Embodiment 2 illustrated in FIG. 16, for example, only either portion of a bottom surface 103Ab of an intermediate layer 103A may protrude toward the hollow portion 150 from the sidewall of the recess 102*a* in the support substrate 102.

Reference is made to FIG. 15. The functional electrode 120 includes a first busbar 5A and a second busbar 6A, which face each other, a plurality of electrodes 3A defining and functioning as a plurality of first electrode fingers connected to the first busbar 5A, and a plurality of electrodes 4A defining and functioning as a plurality of second electrode fingers connected to the second busbar 6A. Each of the plurality of electrodes 3A includes a proximal end connected to the first busbar 5A, and each of the plurality of electrodes 4A includes a proximal end connected to the second busbar 6A. The first busbar 5A is connected to a wiring electrode 161, and the second busbar 6A is connected to a wiring electrode 163. The plurality of electrodes 3A are interdigitated with the plurality of electrodes 4A, and each of the electrodes 3A and an adjacent one of the electrodes 4A define a pair of electrodes.

Next, a non-limiting example of a method for manufacturing the acoustic wave device 100 according to a preferred embodiment of the present invention will be described with reference to FIG. 17 and FIGS. 18A to 20C. The acoustic wave device 100 can be manufactured by, for example, a method described hereinafter.

Figure 18A:
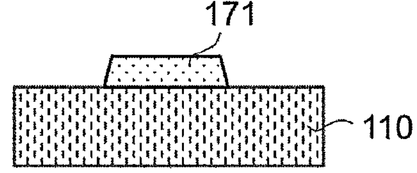
FIG. 18A is a schematic sectional view illustrating an acoustic wave device manufacturing step according to a preferred embodiment of the present invention.

In step S1, as illustrated in FIG. 18A, a first sacrificial layer 171 is formed on the piezoelectric layer 110 by, for example, film deposition. The first sacrificial layer 171 is formed by performing, for example, resist patterning and etching on the piezoelectric layer 110 and then removing the resist.

Figure 18B:
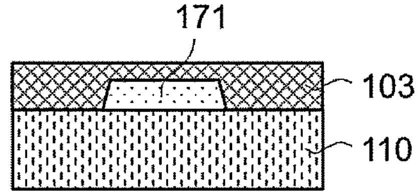
FIG. 18B is a schematic sectional view illustrating an acoustic wave device manufacturing step according to a preferred embodiment of the present invention.

In step S2, as illustrated in FIG. 18B, the intermediate layer 103 is formed by, for example, film deposition on the piezoelectric layer 110 and the first sacrificial layer 171 so as to cover the first sacrificial layer 171. Further, the surface of the intermediate layer 103 is planarized by, for example, grinding.

Figure 18C:
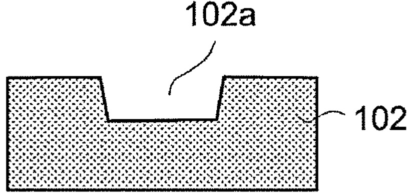
FIG. 18C is a schematic sectional view illustrating an acoustic wave device manufacturing step according to a preferred embodiment of the present invention.

Further, in step S3 in a separate process, a second sacrificial layer 173 is formed on the support substrate 102. First, as illustrated in FIG. 18C, a recess 102*a* is formed in the support substrate 102 to embed the second sacrificial layer 173. The recess 102*a* is formed by, for example, performing resist patterning and dry etching on the support substrate 102 and then removing the resist.

Figure 18D:
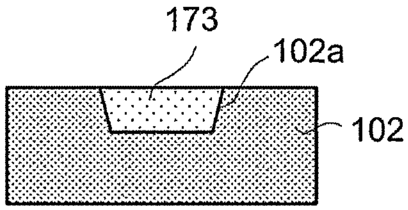
FIG. 18D is a schematic sectional view illustrating an acoustic wave device manufacturing step according to a preferred embodiment of the present invention.

Next, as illustrated in FIG. 18D, a second sacrificial layer 173 is formed on the support substrate 102 by, for example, film deposition, and an exposed surface of the second sacrificial layer 173 is polished to embed the second sacrificial layer 173 in the recess 102*a* in the support substrate 102.

Figure 19A:
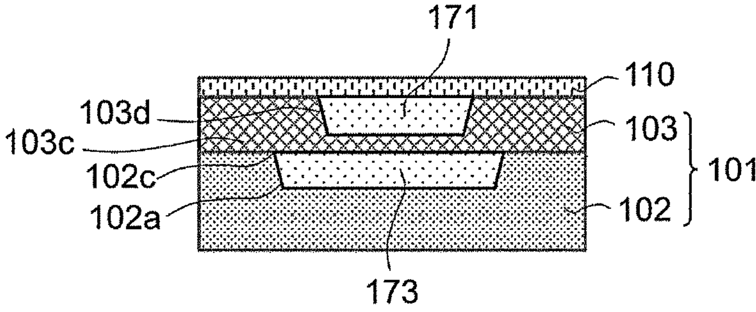
FIG. 19A is a schematic sectional view illustrating an acoustic wave device manufacturing step according to a preferred embodiment of the present invention.

Then, in step S4, the piezoelectric layer 110 on which the intermediate layer 103 is formed in step S2 and the support substrate 102 on which the second sacrificial layer 173 is formed in step S3 are bonded together. As illustrated in FIG. 19A, the intermediate layer 103 is bonded to the second sacrificial layer 173 and the support substrate 102. At this time, a portion of the intermediate layer 103 may be formed on the surfaces of the second sacrificial layer 173 and the support substrate 102 before they are bonded together. The side of the support substrate 102 that includes the second sacrificial layer 173 and the side of the intermediate layer 103 that does not include the first sacrificial layer 171 are bonded together such that the first sacrificial layer 171 and the second sacrificial layer 173 at least partially overlap each other as viewed in plan in the stacking direction of the support 101 and the piezoelectric layer 110 and such that the intermediate layer 103 includes a portion 103*c* protruding inward from the peripheral portion 102*c* of the recess 102*a* in the support substrate 102 as viewed from a cross section in the thickness direction of the support 101. After the intermediate layer 103 and the support substrate 102 are bonded together, an exposed surface of the piezoelectric layer 110 is ground to thin the piezoelectric layer 110. A recess 103*d* is formed in the intermediate layer 103 by the first sacrificial layer 171.

Figure 19B:
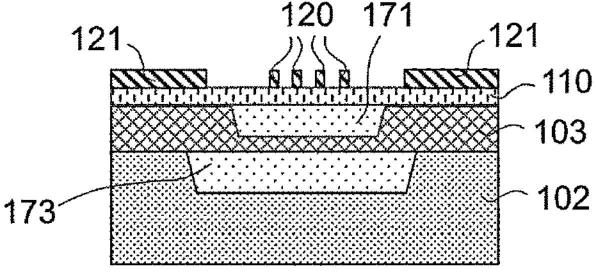
FIG. 19B is a schematic sectional view illustrating an acoustic wave device manufacturing step according to a preferred embodiment of the present invention.
Figure 19C:
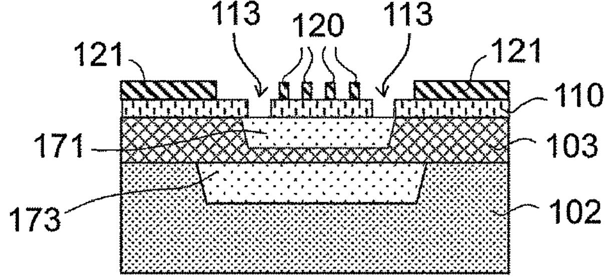
FIG. 19C is a schematic sectional view illustrating an acoustic wave device manufacturing step according to a preferred embodiment of the present invention.
Figure 19D:
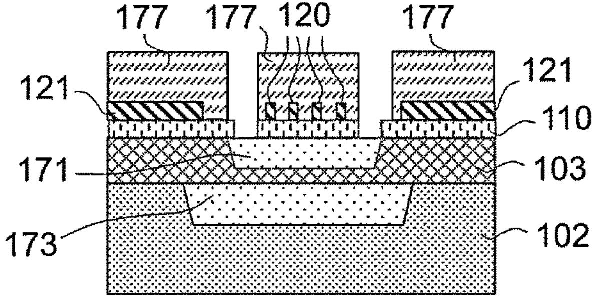
FIG. 19D is a schematic sectional view illustrating an acoustic wave device manufacturing step according to a preferred embodiment of the present invention.

Then, in step S5, as illustrated in FIG. 19B, a functional electrode 120 and a wiring electrode 121 are formed on the piezoelectric layer 110 by, for example, lift-off. Then, as illustrated in FIG. 19C, after resist patterning is performed on the piezoelectric layer 110, the piezoelectric layer 110 is, for example, dry etched and the resist is removed from the piezoelectric layer 110 to form through-holes 113. The through-holes 113 also define and function as cavities in the first sacrificial layer 171. Then, as illustrated in FIG. 19D, a protective resist 177 is formed on the surface of the piezoelectric layer 110, the functional electrode 120, and the wiring electrode 121 to protect them.

Figure 20A:
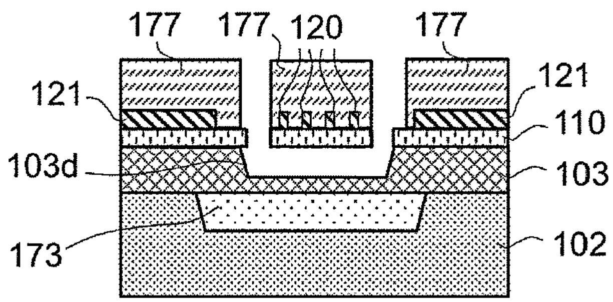
FIG. 20A is a schematic sectional view illustrating an acoustic wave device manufacturing step according to a preferred embodiment of the present invention.
Figure 20B:
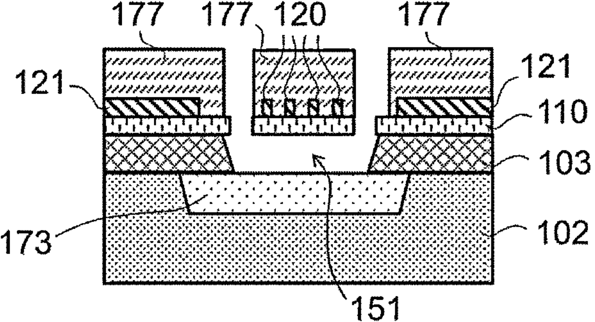
FIG. 20B is a schematic sectional view illustrating an acoustic wave device manufacturing step according to a preferred embodiment of the present invention.

Then, in step S6, etching is performed. As illustrated in FIG. 20A, the first sacrificial layer 171 is etched. Then, as illustrated in FIG. 20B, etching is performed on the intermediate layer 103 to remove the bottom portion of the recess 103*d* in the intermediate layer 103. As a result, a first hollow region 151 is formed in the intermediate layer 103.

Figure 20C:
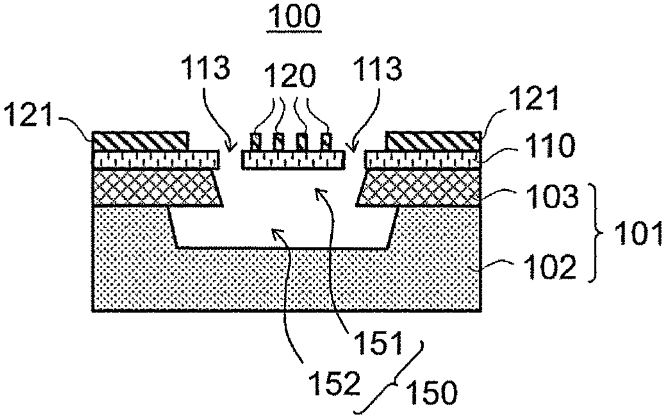
FIG. 20C is a schematic sectional view illustrating an acoustic wave device manufacturing step according to a preferred embodiment of the present invention.

Then, as illustrated in FIG. 20C, the second sacrificial layer 173 is etched, and the protective resist 177 is removed. The second sacrificial layer 173 is etched to form a second hollow region 152 in the support substrate 102. The protective resist 177 is removed to uncover the functional electrode 120 and the wiring electrode 121. In the way described above, the acoustic wave device 100 can be manufactured.

As described above, the acoustic wave device 100 according to Preferred Embodiment 2 includes the support 101 including the support substrate 102 and the intermediate layer 103 formed on the support substrate 102, the piezoelectric layer 110 disposed on the intermediate layer 103 and including the through-hole 113, the functional electrode 120 disposed on the piezoelectric layer 110, and the hollow portion 150 provided in the support substrate 102 and the intermediate layer 103. At least a portion of the functional electrode 120 overlaps the hollow portion 150 as viewed in plan in a stacking direction of the support 101 and the piezoelectric layer 110. The hollow portion 150 includes the first hollow region 151 and the second hollow region 152, the first hollow region 151 being formed in the intermediate layer 103 and communicating with the through-hole 113 in the piezoelectric layer 110, the second hollow region 152 being located between the first hollow region 151 and the bottom surface 102*b* of the recess 102*a* in the support substrate 102, the recess 102*a* opening toward the first hollow region 151. The intermediate layer 103 has a portion protruding inward from the peripheral portion 102*c* of the recess 102*a* in the support substrate 102 as viewed from a cross section in the thickness direction of the support 101.

This portion reduces the width of the first hollow region 151 relatively close to the piezoelectric layer 110. This configuration makes it less likely for the piezoelectric layer 110 to bend toward the hollow portion 150. Even if the piezoelectric layer 110 bends, the depth of the entire hollow portion 150 can be secured, making it possible to eliminate or reduce the sticking of the piezoelectric layer 110 to the support substrate 102.

Figure 21:
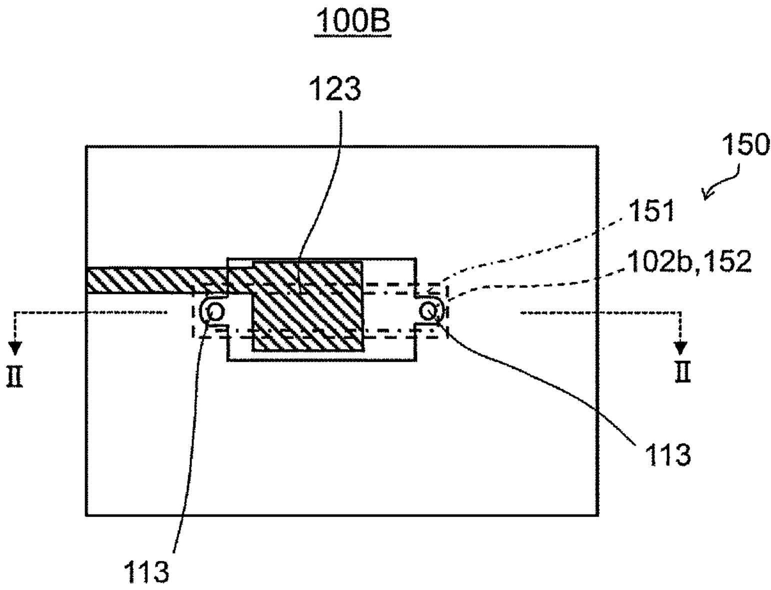
FIG. 21 is a plan view of an acoustic wave device according to a modification of a preferred embodiment of the present invention.
Figure 22:
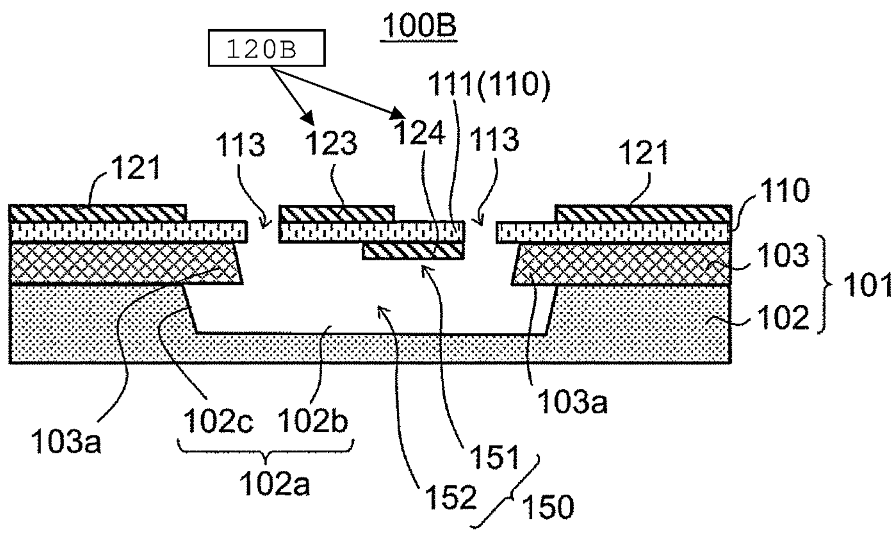
FIG. 22 is a schematic sectional view of an acoustic wave device according to a modification of a preferred embodiment of the present invention.

Next, Modification 2 of Preferred Embodiment 2 will be described with reference to FIG. 21 and FIG. 22. FIG. 21 is a plan view of an acoustic wave device 100B according to Modification 2 of Preferred Embodiment 2. FIG. 22 is a schematic sectional view of the acoustic wave device 100B according to Modification 2 of Preferred Embodiment 2, taken along line II-II in FIG. 21.

As illustrated in FIG. 21 and FIG. 22, in the acoustic wave device 100B, a functional electrode 120B may be a BAW (Bulk Acoustic Wave) element. The functional electrode 120B includes an upper electrode 123 and a lower electrode 124 that face each other in the thickness direction of the piezoelectric layer 110 with the piezoelectric layer 110 interposed therebetween.

The upper electrode 123 and the lower electrode 124 are disposed on the membrane portion 111. The upper electrode 123 is disposed on an exposed surface of the piezoelectric layer 110. The lower electrode 124 is disposed on the side of the piezoelectric layer 110 adjacent to the first hollow region 151. With this configuration, the acoustic wave device 100B can also reduce deterioration in characteristic caused by heat from the outside. This can also make it less likely that the piezoelectric layer 110 will be damaged due to differences in air pressure.

The present invention is not limited to the preferred embodiments described above and may be modified as follows.

In Preferred Embodiment 2 described above, the functional electrode 120 is disposed on the exposed surface of the piezoelectric layer 110. However, it is not limited thereto. The functional electrode 120 may be disposed on the side of the piezoelectric layer 110 adjacent to the hollow portion 150.

While the present invention has been described with a certain degree of particularity with reference to preferred embodiments, it is understood that the disclosure of these preferred embodiments may be changed in the details of construction and that changes in the combination and order of elements in the preferred embodiments can be made without departing from the spirit and scope of the present invention as claimed.

What is claimed is:

1. An acoustic wave device comprising:

a support including a support substrate and an intermediate layer on the support substrate;

a piezoelectric layer on or over the intermediate layer and including a through-hole;

a functional electrode on the piezoelectric layer; and a hollow portion in the support substrate and the intermediate layer; wherein at least a portion of the functional electrode overlaps the hollow portion as viewed in plan view in a stacking direction of the support and the piezoelectric layer;

the hollow portion includes a first hollow region and a second hollow region, the first hollow region being provided in the intermediate layer and communicating with the through-hole in the piezoelectric layer, the second hollow region being located between the first hollow region and a bottom surface of a recess in the support substrate, the recess opening toward the first hollow region;

the intermediate layer includes a portion protruding inward from a peripheral portion of the recess in the support substrate as viewed from a cross section in a thickness direction of the support such that the intermediate layer includes a bottom surface that is more convex toward the hollow portion than an inner wall of the support substrate on a hollow portion side; and as viewed in plan view in the stacking direction of the support and the piezoelectric layer, an area of the first hollow region is larger than an area of the through-hole.

2. The acoustic wave device according to claim 1, wherein the functional electrode includes a first busbar and a second busbar, one or more first electrode fingers connected to the first busbar, and one or more second electrode fingers connected to the second busbar.

3. The acoustic wave device according to claim 2, wherein $d/p \leq$ about 0.5 is satisfied, where d is a thickness of the piezoelectric layer, and p is a center-to-center distance between a first electrode finger and a second electrode finger that are adjacent to each other among the one or more first electrode fingers and the one or more second electrode fingers.

4. The acoustic wave device according to claim 3, wherein d/p is less than or equal to about 0.24.

5. The acoustic wave device according to claim 2, wherein a region where a first electrode finger and a second electrode finger that are adjacent to each other among the one or more first electrode fingers and the one or more second electrode fingers overlap each other when viewed in a direction in which the one or more first electrode fingers and the one or more second electrode fingers are arranged is an excitation region; and MR≤about 1.75 (d/p)+0.075 is satisfied, where MR is a metallization ratio that is a ratio of an area of the first electrode finger and the second electrode finger in the excitation region.

6. The acoustic wave device according to claim 1, wherein the piezoelectric layer includes lithium niobate or lithium tantalate.

7. The acoustic wave device according to claim 6, wherein the lithium niobate or the lithium tantalate has Euler angles (φ, θ, ψ) within a range represented by Expression (1), Expression (2), or Expression (3):

$$(0°\pm10°, 0° \text{ to } 20°, \text{any } \psi) \quad \text{Expression (1);}$$

$$(0°\pm10°, 20° \text{ to } 80°, 0° \text{ to } 60°(1-(\theta-50)^2/900)^{1/2}) \text{ or } (0°\pm10°, 20° \text{ to } 80°, [180°-60°(1-(\theta-50)^2/900)^{1/2}] \text{ to } 180°) \quad \text{Expression (2); and}$$

$$(0°\pm10°, [180°-30°(1-(\omega-90)^2/8100)^{1/2}] \text{ to } 180°, \text{any } \omega) \quad \text{Expression (3).}$$

8. The acoustic wave device according to claim 6, wherein cut angles of the lithium niobate or the lithium tantalate are Z-cut.

9. The acoustic wave device according to claim 1, wherein, as viewed in plan view in the stacking direction of the support and the piezoelectric layer, an area of the recess in the support substrate is larger than the area of the first hollow region.

10. The acoustic wave device according to claim 1, wherein a depth of the second hollow region is larger than a depth of the first hollow region.

11. The acoustic wave device according to claim 1, wherein the acoustic wave device is structured to generate a bulk wave in a thickness-shear mode.

12. The acoustic wave device according to claim 1, wherein the functional electrode includes an upper electrode in an upper portion of the piezoelectric layer and a lower electrode in a lower portion of the piezoelectric layer.

13. The acoustic wave device according to claim 1, wherein a thickness of the piezoelectric layer is greater than or equal to about 50 nm and less than or equal to about 1000 nm.

* * * * *